United States Patent [19]

Kubota et al.

[11] Patent Number: 5,382,469
[45] Date of Patent: Jan. 17, 1995

[54] CERAMIC-TITANIUM NITRIDE ELECTROSTATIC CHUCK

[75] Inventors: Yoshihiro Kubota; Makoto Kawai; Shinji Kojima; Ken-ichi Arai, all of Gunma, Japan

[73] Assignee: Shin-Etsu Chemical Co., Ltd., Tokyo, Japan

[21] Appl. No.: 72,233

[22] Filed: Jun. 3, 1993

[30] Foreign Application Priority Data

Jun. 26, 1992 [JP] Japan .................................. 4-193020

[51] Int. Cl.⁶ ............................................. B32B 18/00
[52] U.S. Cl. .................................. 428/332; 279/128; 361/234; 428/450; 428/469; 428/472; 501/96
[58] Field of Search ............... 428/469, 332, 336, 446, 428/450; 361/230, 233, 234; 501/103, 127, 134, 153, 96; 279/128

[56] References Cited

U.S. PATENT DOCUMENTS

| | | | |
|---|---|---|---|
| 4,692,836 | 9/1987 | Suzuki | 361/234 |
| 5,104,834 | 4/1992 | Watanabe et al. | 501/127 |
| 5,151,845 | 9/1992 | Watanabe et al. | 361/234 |
| 5,191,506 | 3/1993 | Logan et al. | 361/234 |
| 5,280,156 | 1/1994 | Niori et al. | 219/385 |

Primary Examiner—D. S. Nakarani
Assistant Examiner—Stephen Sand
Attorney, Agent, or Firm—McAulay Fisher Nissen Goldbert & Kiel

[57] ABSTRACT

Proposed is a ceramic-made electrostatic chuck consisting of two insulating ceramic layers and a metallic electrode layer integrally sandwiched between the two insulating layers, which has a very quick response characteristic to turning-on and -off of the electric voltage applied to the electrodes without affecting the very high electrostatic attracting force. This improvement can be obtained by forming the insulating ceramic layers from a specific ceramic material consisting of a highly resistive ceramic material such as alumina and the like and titanium nitride admixed with the former in an amount not exceeding 5% by weight but sufficient to impart the insulating ceramic layers with a volume resistivity in the range from $1 \times 10^8$ to $1 \times 10^{13}$ ohm.cm at 20° C.

3 Claims, No Drawings

CERAMIC-TITANIUM NITRIDE ELECTROSTATIC CHUCK

BACKGROUND OF THE INVENTION

The present invention relates to a ceramic-made electrostatic chuck or, more particularly, to a ceramic-made electrostatic chuck capable of electrostatically attracting and holding semiconducting and insulating work pieces irrespective of the temperature in a wide range and still capable of quickly releasing the work piece held thereon when the applied voltage is turned off so as to be useful in the manufacturing process of various kinds of semiconductor devices, liquid crystal display units and the like.

It is a trend in the manufacturing process in the electronic industry of recent years that the traditional wet-process methods are under continuous replacement with dry-process methods such as dry etching, ion implantation, sputtering and the like in view of the higher adaptability of the dry-process to automatization. Since these dry-process procedures are conducted mostly in a vacuum chamber, it is very important to ensure high exactness of positioning of the work piece such as a semiconductor silicon wafer, glass plate and the like on a correct position within a vacuum chamber. This problem is more important in recent years because the size or diameter of the work pieces such as silicon wafers, glass plates is increasing year by year along with an increase in the density of circuit integration and fineness of patterning on the work pieces.

A traditional means for the transportation and holding of a work piece is a vacuum chuck having a perforated chucking plate communicated with a vacuum line so as to attract and hold a work piece by means of the pressure difference between the atmospheric pressure and the reduced pressure inside the chucking head. As is readily understood from the above described working principle, vacuum chucks cannot be used in a vacuum chamber for dry-processing. Although vacuum chucks can be used under non-vacuum conditions, vacuum chucks are accompanied even there by a serious problem that, since the attracting force in a vacuum chuck is localized necessarily on and around the perforations, any work piece attracted to a vacuum chuck is unavoidably in an unevenly stressed state so that vacuum chucks cannot be used when extremely high precision is required in the positioning of work pieces. Accordingly, vacuum chucks have no wide applicability in the modern electronic industry.

In place of the above described vacuum chucks, accordingly, electrostatic chucks, in which work pieces are attracted to and held by a chucking head by means of an electrostatic force, are highlighted in the electronic industry as a transportation and holding means of work pieces. Besides the use as a transportation and holding means, studies are now under way for the use of the attracting force of an electrostatic chuck as a means for the correction of flatness of semiconductor wafers and glass plates as a substrate of liquid crystal display units in view of the increasing importance of the flatness thereof along with the increase in the fineness of working thereon. Because a very large electrostatic attracting force is required for the flatness correction of substrate plates, various proposals and attempts have been made therefor. For example, a proposal has been made in Japanese Patent Kokai 62-94953, 2-206147, 3-147843 and 3-204924, according to which the ceramic base plate, on which the electrodes are formed from a conductive material such as a metal, is prepared with admixture of titanium dioxide so as to decrease the volume resistivity of the ceramic base plate with a consequent increase in the electrostatic attracting force.

When an alumina-based ceramic base plate is prepared with admixture of titanium dioxide, the volume resistivity of the ceramic material is decreased to cause a small electric current therethrough with an increase in the electrostatic attracting force by the Johnsen-Rahbeck effect but a serious problem is caused thereby that, since titanium dioxide is a semiconductive material, a great decrease is caused in the response characteristics to the application and removal of the electric voltage even with an appropriate volume resistivity so that the times taken for reaching the maximum attracting force after application of an electric voltage and taken for the disappearance of the attracting force after removal of the electric voltage are greatly extended. This problem is more serious when the working temperature of the electrostatic chuck is low. In addition, the volume resistivity of an alumina-based ceramic material can be decreased only by the admixture of a quite large amount of titanium dioxide. For example, the volume resistivity of an alumina-based ceramic material can be decreased to $1 \times 10^8$ ohm.cm by the admixture of about 25% by weight of titanium dioxide. In the manufacturing process of semiconductor devices, however, it is generally unpreferable that any body having a possibility of coming into contact with the semiconductor material contains titanium because titanium is sometimes a detrimental dopant against the performance of semiconductor devices. When the semiconductor wafer as the work piece to be attracted by the electrostatic chuck is at room temperature or higher, moreover, the volume resistivity is so low that an unduly large leak current is caused to eventually damage the circuit on the substrate wafer.

SUMMARY OF THE INVENTION

The present invention accordingly has an object to provide a novel ceramic-made electrostatic chuck of which the above described problems in the conventional ceramic-made electrostatic chucks can be solved.

Thus, the ceramic-made electrostatic chuck of the invention comprises two insulating layers made from a ceramic material and an electrode layer made from a metal and integrally sandwiched between the two insulating layers, the ceramic material consisting of a mixture of a highly resistive ceramic powder having a volume resistivity of at least $1 \times 10^{14}$ ohm.cm at 20° C. and a powder of titanium nitride in an amount in the range from 0.1 to 5% by weight thereof so as to have a volume resistivity at 20° C. in the range from $1 \times 10^8$ to $1 \times 10^{13}$ ohm.cm at 20° C. The ceramic-made insulating layers can be formed either by sintering the powder mixture, by the plasma-fusion method with the powder mixture or by any other known methods.

DETAILED DESCRIPTION OF THE PREFERRED EMBODIMENTS

As is understood from the above given description, the most characteristic features in the inventive ceramic-made electrostatic chuck consist in the very specific chemical composition of the insulating ceramic layers having a volume resistivity of the insulating ceramic layer falling within a specific range. When the electrostatic chuck is constructed from such a unique ceramic material, the electrostatic chuck can exhibit strong electrostatic attracting force to various kinds of work pieces but still can quickly release the attracted work piece when the electric voltage applied between the electrodes is turned off. Further, the inventive ceramicmade electrostatic chuck can be used in working with semiconductor materials without troubles due to contamination.

The insulating layers of the inventive ceramic electrostatic chuck are made preferably by the sintering method or by the plasma fusion method from a ceramic powder mixture consisting of a high-resistivity ceramic powder having a volume resistivity of at least $1\times10^{14}$ ohm.cm at 20° C. and a powder of titanium nitride in an amount in the range from 0.1 to 5% by weight based on the amount of the high-resistivity ceramic powder. The insulating ceramic layers should have a volume resistivity in the range from $1\times10^8$ to $1\times10^{13}$ ohm.cm at 20° C.

The above mentioned high-resistivity ceramic material is exemplified by aluminum oxide, zirconium oxide, silicon dioxide, aluminum nitride, boron nitride, Sialon and the like though not particularly limitative thereto. The insulating ceramic layer formed on the metallic electrode layer and coming into contact with a working piece, i.e. the layer forming the working surface, usually has a thickness in the range from 0.3 to 1.0 mm although no good mechanical strength can be obtained thereby since the electrostatic attracting force is decreased when the thickness is too large and the withstand voltage is disadvantageously low when the thickness is too small. On the other hand, the other of the insulating ceramic layers not forming the working surface may have a larger thickness in the range from 0.5 to 25 mm to provide a high mechanical strength. If necessary, the insulating ceramic layer can be integrated with a backup substrate of a metal such as aluminum, copper, stainless steel, titanium and the like in order to prevent breaking thereof during handling.

The electrode layer sandwiched between the two insulating ceramic layers is formed from a metal such as copper, aluminum, titanium, molybdenum, tungsten and the like by the method of screen printing with an electroconductive paste of the metal powder, flame-fusion, photolithographic etching of a metal foil, electrolytic or electroless plating and so on. The electrode layer can be either of the single-electrode type, in which the work piece to be attracted by the electrostatic chuck serves as the counter-electrode, or of the double-electrode type, in which the electrode layer consists of a pair of two electrodes.

When the insulating ceramic layer is formed from a mixture of a high-resistivity ceramic powder and a powder of titanium nitride to have a volume resistivity of $1\times10^8$ to $1\times10^{13}$ ohm.cm at 20° C., the mobility of electric charges through the ceramic layer is much larger than in a ceramic layer having the same volume resistivity by the admixture of titanium dioxide so that the inventive electrostatic chuck has a great advantage of a greatly decreased response time for the attraction and release of the work piece when the electric voltage applied between the electrodes is turned on or off. Namely, the work piece attracted and held by the electrostatic chuck can be quickly released when the electric voltage between the electrodes is turned off.

Although the inventive ceramic-made electrostatic chuck can exhibit a strong attracting force, quick response characteristic and safety from device damages against electronic circuits when the volume resistivity of the insulating ceramic layers is within the above mentioned specific range, the exact value of the volume resistivity of the ceramic layer should be selected depending on the temperature at which the electrostatic chuck is used. For example, when the temperature of a silicon wafer to be attracted and held by the electrostatic chuck is 20° C. or below, good performance characteristics of the chuck can be obtained with the ceramic layers having a volume resistivity in the range from $1\times10^8$ to $1\times10^{12}$ ohm.cm. The volume resistivity of the insulating ceramic layer can be controlled by modifying the amount of the titanium nitride powder blended with the high-resistivity ceramic powder.

To test the influence of the volume resistivity of the insulating ceramic layers on the performance of the electrostatic chuck of the invention, four electrostatic chucks were prepared, of which the insulating ceramic layers had varied volume resistivities of $1\times10^7$, $1\times10^8$, $9\times10^{11}$ and $1\times10^{12}$ ohm.cm at 20° C. from blends of an aluminum oxide powder and a titanium nitride powder in amounts of 5.5%, 5.0%, 4.5% and 1.0% by weight, respectively. A DC voltage of $\pm1$ kV was applied to the electrodes of the chuck chilled and held at $-10°$ C. and the attracting performance thereof was tested with a semiconductor silicon wafer at 0° C. as the work piece. The results were that the silicon wafer could be attracted and held by the chuck when the volume resistivity of the ceramic layer was $9\times10^{11}$ ohm.cm or lower while the chuck with the ceramic layer having a volume resistivity of $1\times10^{12}$ ohm.cm failed to attract the silicon wafer and no device damage was detected on the silicon wafer when the volume resistivity of the ceramic layers was $1\times10^8$ or $9\times10^{11}$ ohm.cm while device damage was found with the electrostatic chuck in which the ceramic layer had a volume resistivity of $1\times10^7$ ohm.cm.

When the temperature of the silicon wafer as a work piece to be attracted by the electrostatic chuck is 20° C. or higher, it is preferable to use an electrostatic chuck of which the insulating ceramic layers have a volume resistivity in the range from $1\times10^{12}$ to $1\times10^{13}$ ohm.cm at 20° C. because the electric current passing to the silicon wafer is so small that no device damage is caused to the circuit formed on the silicon wafer.

Further to test the influence of the volume resistivity of the insulating ceramic layers on the performance of the chucks, four more electrostatic chucks were prepared, of which the insulating ceramic layers had a volume resistivity of $9\times10^{11}$, $1\times10^{12}$, $1\times10^{13}$ or $2\times10^{13}$ ohm.cm at 20° C. from blends of an aluminum oxide powder and a titanium nitride powder in amounts of 4.5%, 1.0%, 0.5% and 0.4% by weight, respectively. A DC voltage of $\pm1$ kV was applied between the electrodes of the electrostatic chuck which was heated at about 110° C. and the attracting performance thereof was tested with a semiconductor silicon wafer heated at 100° C. as the work piece. The results were that the silicon wafer could be attracted and firmly held by the chuck when the volume resistivity of the insulating ceramic layers was $1\times10^{13}$ ohm.cm or lower while the chuck with the ceramic layers having a volume resistivity of $2\times10^{13}$ ohm.cm failed to attract the silicon wafer. No device damage was caused with the electrostatic chucks in which the insulating ceramic layers had a volume resistivity of $1\times10^{12}$ or $1\times10^{13}$ ohm.cm while device damage was caused with the electrostatic chuck in which the insulating ceramic layers had a volume resistivity of $9 \times 10^{11}$ ohm.cm.

For comparison, similar performance tests to the above were undertaken with comparative electrostatic chucks prepared with titanium dioxide in place of titanium nitride. The results were that, although approximately the same results were obtained in respect of the attracting and holding power to the silicon wafer and occurrence of device damages, the most remarkable difference was in the response velocity. Namely, for example, the full attracting force could be exhibited only after about 30 seconds from the moment when the electric voltage applied to the electrodes was turned on. The silicon wafer attracted and held by the electrostatic chuck could be released and fall only after lapse of about 60 seconds from the moment when the electric voltage applied between the electrodes was turned off.

The above described experimental results support the conclusion that the best performance of the electrostatic chuck can be obtained when the insulating ceramic layers have a volume resistivity in the range from $1 \times 10^8$ to $1 \times 10^{13}$ ohm.cm at 20° C. When this requirement is satisfied, a very small electric current passes between the ceramic layer of the electrostatic chuck and the silicon wafer as the work piece so that a strong electrostatic attracting force is generated by the Johnsen-Rahbeck effect to exhibit a good attracting and holding force. In addition, the inventive electrostatic chuck is advantageous in respect of the response characteristics by virtue of the use of titanium nitride as a constituent of the insulating ceramic layers. A further advantage of the inventive electrostatic chuck is the absence of the risk to cause device damages to the work pieces attracted thereby.

Since the electrostatic attracting force of an electrostatic chuck is expressed by the equation: $f = A \cdot \epsilon (E/t)^2$, in which f is the electrostatic attracting force, $\epsilon$ is the dielectric constant of the insulating layer on the electrode layer, E is the electric voltage applied between the electrodes, t is the thickness of the insulating layer on the electrode layer and A is a constant, it is optional that, when an increase in the dielectric constant of the insulating ceramic layer is desired, the ceramic layers are prepared from a ceramic powder mixture with admixture of a third ceramic powder having a high dielectric constant such as barium titanate, lead titanate, zirconium titanate, PLZT and the like in such an amount that the volume resistivity of the insulating ceramic layer falls within the specified range and no particular adverse influences are caused on the semiconductor device as the work piece on the electrostatic chuck.

In the following, the ceramic-made electrostatic chuck of the present invention is described in more detail by way of examples and comparative examples.

EXAMPLE 1

A slurried mixture was prepared by blending 100 parts by weight of a ceramic powder mixture consisting of 93% by weight of an aluminum oxide powder, 4% by weight of a silicon dioxide powder and 3% by weight of a magnesium oxide powder together with 4 parts by weight of a titanium nitride powder, 8 parts by weight of a butyral resin, 60 parts by weight of ethyl alcohol and 10 parts by weight of dioctyl phthalate in a ball mill for 24 hours.

The thus prepared slurry was deaerated under reduced pressure along with partial evaporation of the solvent to give a slurry having a viscosity of 30,000 centipoise. A green sheet having a thickness of 1 mm as dried was prepared from this slurry by using a doctor blade and two discs each having a diameter of 160 mm were prepared by cutting the green sheet. A pair of concentrically circular electrodes having a gap distance of 2.5 mm were formed on one of the green sheet discs by the method of screen printing with a tungsten paste and this green sheet disc was integrated with the other green sheet disc laid on the printed surface in a hot press heated at 100° C. under a pressure of 30 kg/cm² followed by sintering at 1550° C. for 2 hours in an atmosphere of a gaseous mixture of 85% by volume of nitrogen and 15% by volume of hydrogen to give an integrally sintered body of which the insulating ceramic layers had a volume resistivity of $5 \times 10^8$ ohm.cm at 20° C.

In the next place, this sintered disc was ground on both surfaces until the thickness was reduced to 1 mm and lead wires were bonded to the electrodes to give a base plate of the electrostatic chuck. A DC voltage of $\pm 1$ kV was applied between the electrodes to attract a semiconductor silicon wafer of 6 inches diameter and 0.5 mm thickness and the electrostatic attracting force was determined by using an electrostatic tester while the silicon wafer was chilled at 0° C. to obtain a value of 5 g/cm² to be high enough for the planarity correction of the silicon wafer. When the voltage applied between the electrodes was turned off, the silicon wafer was immediately released to show a good response characteristic.

EXAMPLE 2

Another ceramic-made electrostatic chuck was prepared in just the same manner as in Example 1 except that the amount of the titanium nitride powder was decreased to 0.7 part by weight. The thus prepared ceramic layer had a volume resistivity of $8 \times 10^{12}$ ohm.cm at 20° C. The same test as in Example 1 was undertaken with this electrostatic chuck except that the temperature of the electrostatic chuck and the silicon wafer was 100° C. The electrostatic attracting force determined by using an electrostatic tester was 15 g/cm². The silicon wafer released from the chuck by removing the voltage was microscopically inspected to find absolutely no damages in the electric circuit formed thereon.

Comparative Example 1

A comparative ceramic-made electrostatic chuck was prepared in the same manner as in Example 1 excepting replacement of 4 parts by weight of the titanium nitride powder with 15 parts by weight of a titanium dioxide powder. The thus prepared ceramic layer had a volume resistivity of $2 \times 10^{12}$ ohm.cm at 20° C. The same test as in Example 1 was undertaken with a silicon wafer chilled and kept at 0° C. to find that the electrostatic attracting force was 3 g/cm², which value, however, could be exhibited only after about 15 seconds from the moment when the electric voltage applied between the electrodes was turned on.

Comparative Example 2

A further comparative electrostatic chuck was prepared in the same manner as in Comparative Example 1 except that the amount of the titanium dioxide powder was decreased to 2.5 parts by weight. The thus prepared insulating ceramic layer had a volume resistivity of $1 \times 10^{13}$ ohm.cm at 20° C. The same test as in Example 1 was undertaken with a silicon wafer heated and kept at 100° C. to find that the electrostatic attracting force was 10 g/cm², which value could be achieved only after 2 minutes or longer from the moment when the electric voltage applied between the electrodes was turned on. The silicon wafer released from the electrostatic chuck by turning off the voltage between the electrodes was inspected to show disordered conduction in the electric circuit formed thereon presumably due to intrusion of the titanium dioxide particles into the circuit.

What is claimed is:

1. A ceramic electrostatic chuck which comprises:
   two insulating layers made from a ceramic material and an electrode layer made from a metal and integrally sandwiched between the insulating layers;
   the ceramic material consisting of a mixture of a resistive ceramic material having a volume resistivity of at least $1 \times 10^{14}$ ohm.cm at 20° C. and means to provide the ceramic material of the insulating layers with a volume resistivity in the range from $1 \times 10^8$ to $1 \times 10^{13}$ ohm.cm at 20° C., said means being titanium nitride, the amount of titanium nitride not exceeding 5% by weight based on the amount of the resistive ceramic material.

2. The ceramic electrostatic chuck as claimed in claim 1 in which the resistive ceramic material is selected from the group consisting of aluminum oxide, aluminum nitride, zirconium oxide, silicon dioxide, and boron nitride.

3. The ceramic electrostatic chuck as claimed in claim 1 in which one of the two insulating layers has a thickness in the range from 0.3 to 1.0 mm and the other of the two insulating layers has a thickness in the range from 0.5 to 25 mm.

* * * * *